(12) United States Patent
Yoon et al.

(10) Patent No.: US 9,923,042 B2
(45) Date of Patent: Mar. 20, 2018

(54) ORGANIC LIGHT-EMITTING DIODE (OLED) DISPLAY

(71) Applicant: Samsung Display Co., Ltd., Yongin, Gyeonggi-Do (KR)

(72) Inventors: Joo-Sun Yoon, Yongin (KR); Ki-Wan Ahn, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/526,277

(22) Filed: Oct. 28, 2014

(65) Prior Publication Data

US 2015/0364530 A1 Dec. 17, 2015

(30) Foreign Application Priority Data

Jun. 13, 2014 (KR) .................. 10-2014-0072302

(51) Int. Cl.
*H01L 27/32* (2006.01)

(52) U.S. Cl.
CPC ........ *H01L 27/3276* (2013.01); *H01L 27/326* (2013.01)

(58) Field of Classification Search
CPC ............. H01L 27/3276; H01L 27/3206; H01L 51/5203; H01L 27/3265; H01L 27/3262; H01L 51/524
See application file for complete search history.

(56) References Cited

U.S. PATENT DOCUMENTS

| | | | |
|---|---|---|---|
| 2008/0297032 A1 | 12/2008 | Kim et al. | |
| 2009/0295280 A1 | 12/2009 | Yang | |
| 2010/0141640 A1* | 6/2010 | Furuie | G09G 3/3233 345/213 |
| 2011/0102308 A1* | 5/2011 | Nakamura | H01L 27/14601 345/84 |
| 2011/0220901 A1* | 9/2011 | Ha | H01L 27/3258 257/59 |
| 2011/0221661 A1 | 9/2011 | Yoon et al. | |
| 2011/0241014 A1 | 10/2011 | Yoon et al. | |
| 2012/0153286 A1* | 6/2012 | Yoon | B82Y 10/00 257/59 |
| 2013/0208017 A1 | 8/2013 | Gu et al. | |
| 2013/0314433 A1 | 11/2013 | Ko | |

FOREIGN PATENT DOCUMENTS

| | | |
|---|---|---|
| KR | 10-0858823 B1 | 9/2008 |
| KR | 10-0911993 B1 | 8/2009 |
| KR | 10-2011-0101778 A | 9/2011 |
| KR | 10-2011-0111104 A | 10/2011 |
| KR | 10-2013-0093328 A | 8/2013 |

* cited by examiner

*Primary Examiner* — Marc Armand
*Assistant Examiner* — Sue Tang
(74) *Attorney, Agent, or Firm* — Knobbe Martens Olson & Bear LLP (57) ABSTRACT

An organic light-emitting diode (OLED) display is disclosed. In one aspect, the display includes a substrate and a plurality of pixels formed over the substrate. Each of the pixels comprises a first region configured to emit light and a second region configured to pass external light therethrough. The second regions of at least three adjacent ones of the pixels have different areas.

20 Claims, 5 Drawing Sheets

ORGANIC LIGHT-EMITTING DIODE (OLED) DISPLAY

INCORPORATION BY REFERENCE TO ANY PRIORITY APPLICATIONS

This application claims the benefit of Korean Patent Application No. 10-2014-0072302, filed on Jun. 13, 2014, in the Korean Intellectual Property Office, the disclosure of which is incorporated herein in its entirety by reference.

BACKGROUND

Field

The described technology generally relates to organic light-emitting diode (OLED) displays.

Description of the Related Technology

An OLED display is self-emissive, and includes OLEDs. An OLED includes a hole injecting electrode, an electron injecting electrode, and an organic emission layer interposed therebetween. The OLED emits light when excitons generated via recombination of holes injected from the hole injecting electrode and electrons injected from the electron injecting electrode in the organic emission layer drop from an excited state to a ground state.

Recently, OLED displays have been used in various applications such as MP3 players, smartphones, TVs, and the like, and their scope of use has grown wider due to their favorable characteristics such as reduced thickness and weight, a wide viewing angle, high contrast ratio, and quick response.

SUMMARY OF CERTAIN INVENTIVE ASPECTS

One inventive aspect is an OLED display.

Another aspect is an OLED display which includes: a substrate; and a plurality of pixels disposed on the substrate and respectively including a first region emitting light and a second region transmitting external light, wherein at least three pixels adjacent to one another among the plurality of pixels respectively have different areas of the second regions.

Each pixel may have a random area of the second region.

The first region may include a first emission unit, a second emission unit, and a third emission unit respectively emitting different colors, and the second region may be disposed to correspond to the first emission unit, the second emission unit, and the third emission unit adjacent to one another.

The OLED display may further includes: a plurality of first wirings formed in a first direction to pass the first region; and a plurality of second wirings formed in a second direction to pass the first region and the second region, wherein at least one of the second wirings includes a first portion formed of a transparent material and a second portion formed of an opaque material and electrically connected to the first portion, the first portion at least partially corresponding to the second region.

The first portion of the second wiring may include at least one material selected from the group consisting of indium tin oxide (ITO), indium zinc oxide (IZO), carbon nanotube, and graphene.

The OLED display may further include a plurality of pixels circuit units respectively disposed in the first region of each pixel and respectively including at least one thin film transistor and a capacitor; a first insulating layer covering the pixel circuit units; a plurality of first electrodes formed on the first insulating layer, independently disposed in the first region of each of the pixels, and electrically connected to each of the pixel circuit units; a second insulating layer covering at least one portion of the first electrode; a second electrode opposite to the first electrode, electrically connected to each of the pixels, and formed at least in the first region in each of the pixels; and an organic emission layer interposed between the first electrode and the second electrode and emitting light.

The first portion and the second portion of the second wiring may be disposed on different layers.

The thin film transistor may include: an active layer disposed on the substrate; a gate electrode disposed at a position corresponding to the active layer to be insulated from the active layer; an interlayer insulating layer disposed on the gate electrode; and a source electrode and a drain electrode disposed on the interlayer insulating layer and respectively electrically connected to the active layer, and the capacitor may include: a lower electrode disposed on the same layer as the gate electrode; and an upper electrode insulated from the lower electrode.

The first portion of the second wiring may be disposed on the same layer as the first electrode, the gate electrode, and/or the upper electrode, the second portion of the second wiring may be disposed on the same layer as the source electrode and the drain electrode, and the first insulating layer and/or the interlayer insulating layer may have a contact hole electrically connecting the first portion with the second portion.

The first electrode may be a reflective electrode, the second electrode may be a transparent or semi-transparent electrode, and the pixel circuit unit may be disposed at a region overlapping the first electrode in plan view.

The first electrode may be a transparent or semi-transparent electrode, the second electrode may be a reflective electrode, and the pixel circuit unit may be disposed at a region not overlapping a region exposed by the second insulating layer of the first electrode in plan view.

The second electrode may include a first transmission window at a position corresponding to the second region. The second insulating layer may include a second transmission window connected to the first transmission window.

Another aspect is an organic light-emitting diode (OLED) display, comprising: a substrate; and a plurality of pixels formed over the substrate, wherein each of the pixels comprises a first region configured to emit light and a second region configured to pass external light therethrough, wherein the second regions of at least three adjacent ones of the pixels have different areas.

In the above display, the second regions of the pixels have randomly defined areas. In the above display, the first region comprises a first emission unit, a second emission unit, and a third emission unit configured to respectively emit different colors, and wherein the second region corresponds to the first emission unit, the second emission unit, and the third emission unit that are adjacent to one another. The above display further comprises: a plurality of first wirings formed in a first direction to pass through the first region; and a plurality of second wirings formed in a second direction to pass through the first and second regions, wherein at least one of the second wirings comprises a first portion formed of a transparent material and a second portion formed of an opaque material and electrically connected to the first portion, and wherein the first portion at least partially corresponds to the second region.

In the above display, the first portion of the second wiring comprises at least one material selected from the group consisting of indium tin oxide (ITO), indium zinc oxide (IZO), carbon nanotube, and graphene. The above display further comprises: a plurality of pixel circuit units respectively placed in the first regions of each pixel, wherein each of the pixel circuit units comprises at least one thin film transistor (TFT) and a capacitor; a first insulating layer covering the pixel circuit units; a plurality of first electrodes formed over the first insulating layer, independently formed in the first region of each of the pixels, and electrically connected to each of the pixel circuit units; a second insulating layer covering at least one portion of the first electrode; a second electrode opposite to the first electrode, electrically connected to each of the pixels, and formed at least in the first region in each of the pixels; and an organic emission layer interposed between the first and second electrodes and configured to emit light.

In the above display, the first and second portions of the at least one second wiring are formed on different layers. In the above display, the TFT comprises: an active layer formed over the substrate; a gate electrode formed at a position corresponding to the active layer to be insulated from the active layer; an interlayer insulating layer formed over the gate electrode; and a source electrode and a drain electrode formed over the interlayer insulating layer, wherein each of the source and drain electrodes is electrically connected to the active layer, and wherein the capacitor comprises: a lower electrode formed on the same layer as the gate electrode; and an upper electrode insulated from the lower electrode.

In the above display, the first portion of the at least one second wiring is formed on the same layer as the first electrode, the gate electrode, and/or the upper electrode, wherein the second portion of the at least one second wiring is formed on the same layer as the source electrode and the drain electrode, and wherein the first insulating layer and/or the interlayer insulating layer have a contact hole electrically connecting the first portion with the second portion. In the above display, the first electrode is a reflective electrode, wherein the second electrode is a transparent or semi-transparent electrode, and wherein the pixel circuit unit is placed at a region at least partially overlapping the first electrode in a plan view.

In the above display, the first electrode is a transparent or semi-transparent electrode, wherein the second electrode is a reflective electrode, and wherein the pixel circuit unit is placed at a region not overlapping a region exposed by the second insulating layer of the first electrode in a plan view. In the above display, the second electrode comprises a first transmission window at a position corresponding to the second region. In the above display, the second insulating layer comprises a second transmission window connected to the first transmission window.

Another aspect is an organic light-emitting diode (OLED) display, comprising: a substrate; a plurality of pixels formed over the substrate, wherein each of the pixels comprises a first region configured to emit light and a second region configured to substantially transmit external light; and a plurality of wirings crossing the first and second regions, wherein at least one of the wirings comprises a first portion formed of a transparent material.

In the above display, the first portion of the at least one wiring is formed of one or more of: indium tin oxide (ITO), indium zinc oxide (IZO), carbon nanotube, and graphene. In the above display, the at least one wiring comprises a second portion formed of an opaque material and electrically connected to the first portion. In the above display, the first and second portions of the at least one wiring are formed on different layers. In the above display, the second regions of at least three adjacent ones of the pixels have different areas. In the above display, the second regions of the pixels have different areas. In the above display, the area of the second region in a selected pixel is greater than that of the first region in the selected pixel.

DETAILED DESCRIPTION OF CERTAIN INVENTIVE EMBODIMENTS

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto. In this disclosure, the term "substantially" includes the meanings of completely, almost completely or to any significant degree under some applications and in accordance with those skilled in the art. Moreover, "formed on" can also mean "formed over." The term "connected" includes an electrical connection.

Embodiments will now be described more fully with reference to the accompanying drawings.

Figure 1:
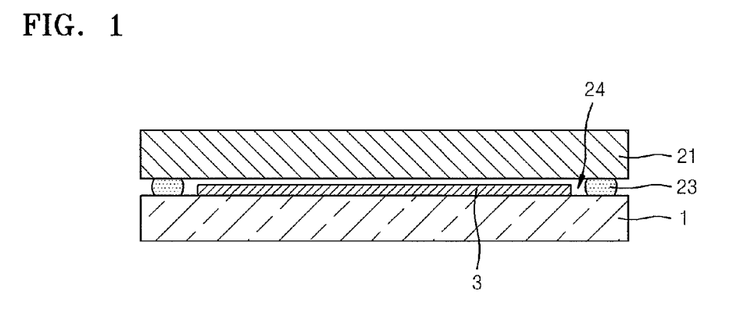
FIG. 1 is a cross-sectional view schematically illustrating an OLED display according to an embodiment.

FIG. 1 is a cross-sectional view schematically illustrating an OLED display according to an embodiment.

Referring to FIG. 1, an organic light-emitting unit 3, which includes a plurality of pixels P1 to P12 (FIG. 3) each including a first region 100 (FIG. 3) emitting light and a second region 200 (FIG. 3) passing external light therethrough, and a sealing substrate 21, which seals the organic light-emitting unit 3, are sequentially placed on a substrate 1. The substrate 1 and the sealing substrate 21 may be a glass substrate or a plastic substrate, and one of the substrate 1 and the sealing substrate 21 placed at a portion in which an image is not formed may be a metal substrate.

The substrate 1 may be bonded to the sealing substrate 21 via a sealant 23 formed at edges thereof, and space 24 between the substrate 1 and the sealing substrate 21 may be sealed. An absorbent or a filler may be formed in the space 24.

Figure 2:
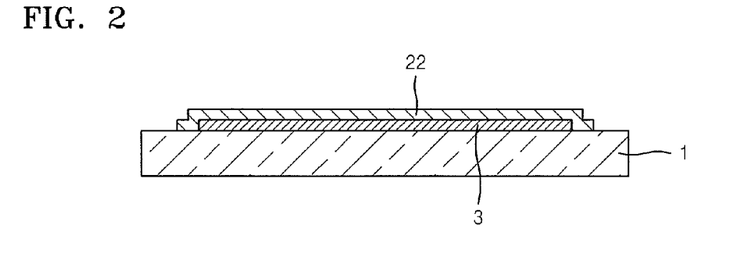
FIG. 2 is a cross-sectional view schematically illustrating an OLED display according to another embodiment.

FIG. 2 is a cross-sectional view schematically illustrating an OLED display according to another embodiment of the present invention.

Referring to FIG. 2, an organic light-emitting unit 3, which includes a plurality of pixels P1 to P12 each including a first region 100 (FIG. 3) emitting light and a second region 200 (FIG. 3) passing external light therethrough, and a sealing film 22, which is a thin film sealing the organic light-emitting unit 3, may be sequentially formed on a substrate 1. The sealing film 22 may have a structure in which a film formed of an inorganic material such as silicon oxide or silicon nitride and a film formed of an organic material such as epoxy or polyimide are alternately stacked without being limited thereto, but any thin film type sealing structure may also be applied to the sealing film 22.

Although not shown herein, a structure including both the sealing film 22 of FIG. 2 and the sealing substrate 21 of FIG. 1 may also be used as the structure for sealing the organic light-emitting unit 3.

Figure 3:
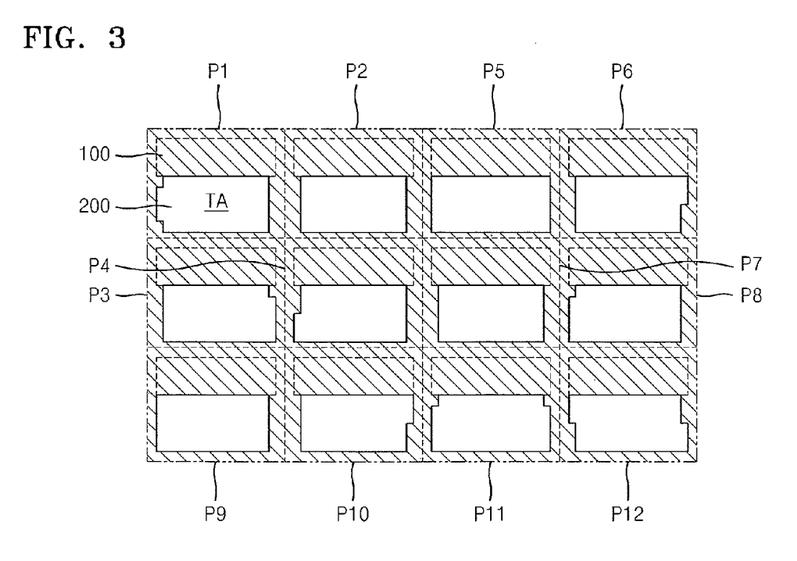
FIG. 3 is a plan view schematically illustrating some of a plurality of pixels included in an organic light-emitting unit according to an embodiment.
Figure 4:
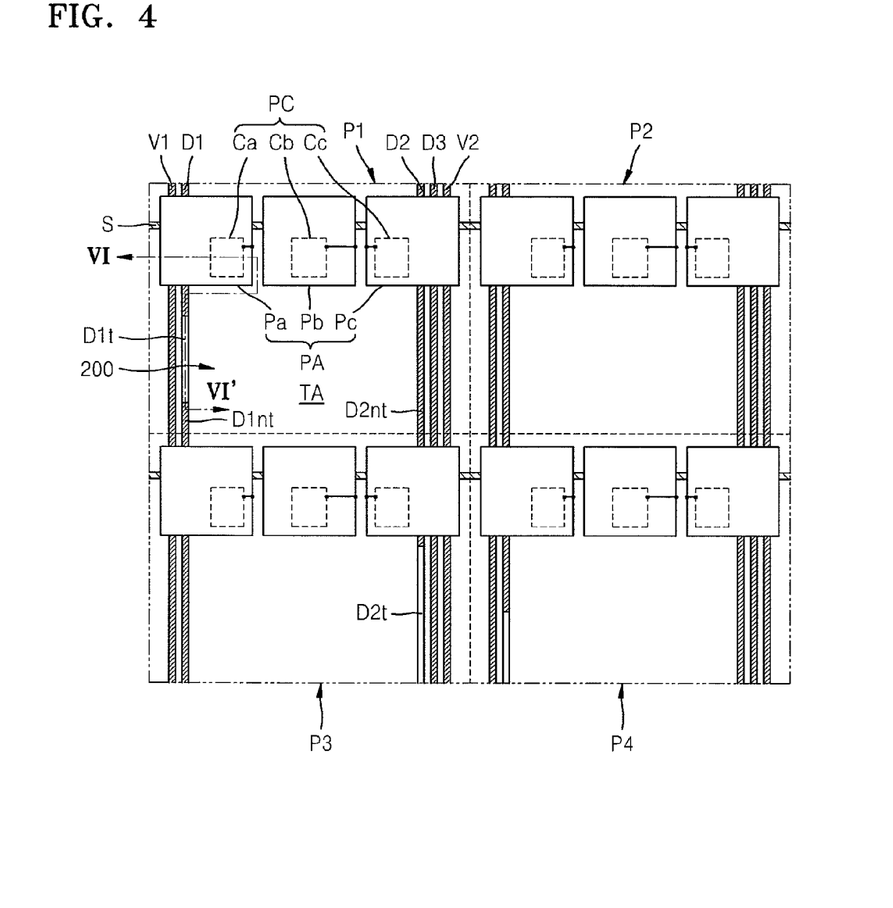
FIG. 4 is a plan view illustrating some of the pixels of FIG. 3 in more detail.

Referring to FIGS. 3 and 4, the organic light-emitting unit 3 (FIGS. 1 and 2) includes the plurality of pixels P1 to P12.

Each of the pixels P1 to P12 includes the first region 100 emitting light and the second region 200 passing external light therethrough, and at least three pixels adjacent to one another among the plurality of pixels P1 to P12 may occupy second regions 200 with different areas.

Since each of the pixels P1 to P12 includes the first region 100 emitting light and the second region 200 passing external light therethrough in the OLED display, a user can see through the OLED display (see the vertical arrows reflected in the second region 200 of the pixels in FIGS. 6-9). That is, the described OLED display is a transparent display.

In the first region 100, a pixel circuit unit PC including at least one thin film transistor (TFT) and a light-emitting region PA including an organic light-emitting device (OLED, FIG. 6) may be disposed. The light-emitting region PA may realize white light emission by a first emission unit Pa, a second emission unit Pb, and a third emission unit Pc respectively emitting different colors, and each of the first emission unit Pa, the second, emission unit Pb, and the third emission unit Pc may be driven by a first circuit unit Ca, a second circuit unit Cb, and a third circuit unit Cc, respectively. According to an embodiment, the first emission unit Pa, the second emission unit Pb, and the third emission unit Pc may respectively be a red sub-pixel, a green sub-pixel, and a blue sub-pixel.

Figure 6:
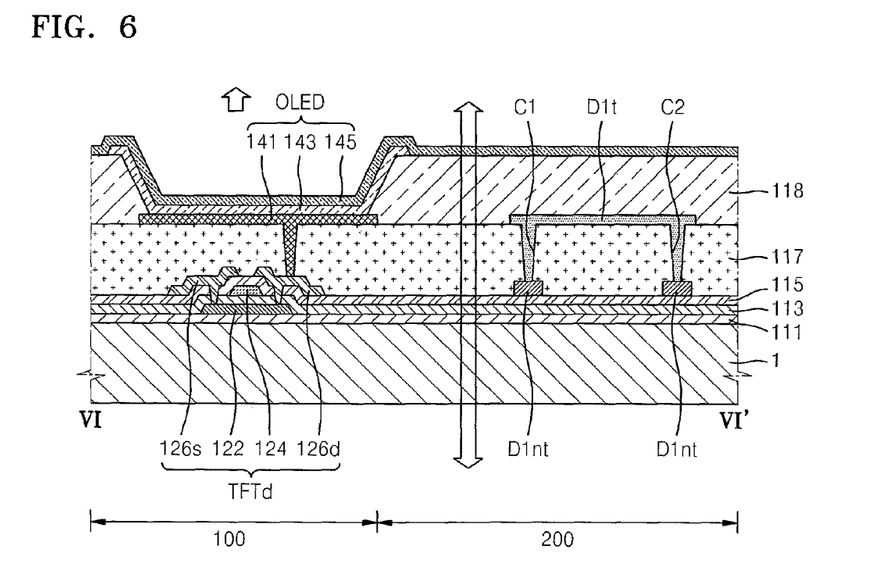
FIG. 6 is a cross-sectional view taken along a line VI-IV' of FIG. 4.

The pixel circuit unit PC may be placed in a region planarly overlapping the light-emitting region PA, i.e., a first electrode 141 (FIG. 6). This structure is suitable for an OLED display including the first electrode 141 (FIG. 6) formed in the light-emitting region PA as a reflective electrode and a second electrode 145 (FIG. 6) as a transparent or semi-transparent electrode, i.e., a top emission type OLED display. By disposing the pixel circuit unit PC between the substrate 1 (FIG. 6) and the first electrode 141 (FIG. 6), space for disposing the pixel circuit unit PC is not separately required, thereby improving an aperture ratio.

In the second region 200, a device including opaque materials such as a reflective electrode and wiring is not disposed, and only a transparent insulating layer, and the like may be disposed. The second region 200 may be defined by opaque wirings passing edges of each of the pixels P1 to P12.

More particularly, the OLED display according to an embodiment may include a first wiring S formed in a first direction (transverse direction) to pass the first region 100 and second wirings D1, D2, and D3 formed in a second direction (longitudinal direction) to pass the first region 100 and the second region 200.

The first wiring S and the second wirings D1, D2, and D3 may respectively correspond to a scan line transmitting scan signals and a data line transmitting data signals. The first wiring S and the second wirings D1, D2, and D3 may be electrically connected to a switching TFT (not shown) included in the pixel circuit unit PC. The pixel circuit unit PC further includes a driving TFT (not shown), and the driving TFT may be electrically connected to the switching TFT and driving voltage lines V1 and V2 supplying driving voltage. Each of the plurality of second wiring D1, D2, and D3 and each of the plurality of driving voltage lines V1 and V2 passing through each pixel may respectively be connected to the first circuit unit Ca, the second circuit unit Cb, and the third circuit unit Cc. Since two driving voltage lines V1 and V2 are used herein, a description will be given of two circuit units connected to one driving voltage line. However, the number of the driving voltage lines may be the same as that of the circuit units, and each of the driving voltage line may respectively be connected to each of the circuit units.

At least one of the second wirings D1, D2, and D3 has a first portion D1$t$ and D2$t$ formed of a transparent material and a second portion D1$nt$ and D2$nt$ formed of an opaque material. According to an embodiment, the first second wiring D1 has the first portion D1$t$ and the second portion D1$nt$ electrically connected to the first portion D1$t$ and the second wiring D2 has the first portion D2$t$ and the second portion D2$nt$ electrically connected to the first portion D2$t$.

The first portion D1$t$ and D2$t$ may be formed of at least one material selected from the group consisting of indium tin oxide (ITO), indium zinc oxide (IZO), carbon nanotube, and graphene.

A position of the first portion D1$t$ and D2$t$ or an area of the first portion D1$t$ and D2$t$ may vary in the pixels P1 to P12, and thus the pixels P1 to P12 may occupy different areas of the second regions 200 defined by the second portion D1$nt$ and D2$nt$ formed of an opaque material. That is, the second region 200 included in each of the pixels P1 to P12 may have a randomly defined area.

In a transparent OLED display by which external light permits viewing of images visible through the second region 200, light passing through the second region 200 may be diffracted by opaque wirings.

That is, since the plurality of second regions 200 respectively included in the plurality of pixels P1 to P12 function as a multi-slit, an external image is split into several images due to constructive interference of light diffracted by the second region 200, thereby reducing clearness.

However, the OLED display according to an embodiment reduces constructive interference of diffracted light by increasing the degree of randomness of the area of the second region 200 included in each of the pixels P1 to P2, thereby improving clearness of the external image.

Figure 5:
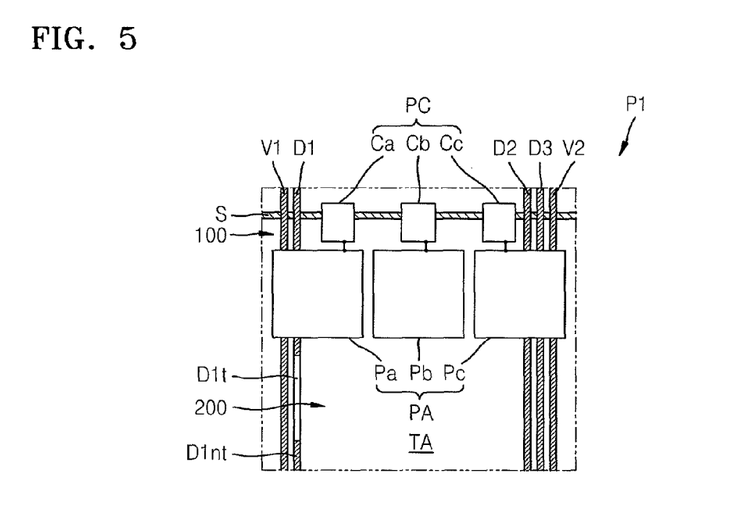
FIG. 5 is a plan view schematically illustrating a pixel included in an organic light-emitting unit according to another embodiment.

FIG. 5 is a plan view schematically illustrating a pixel included in an organic light-emitting unit according to another embodiment.

Referring to FIG. 5, one pixel P1 of the organic light-emitting unit according to the illustrated embodiment includes a first region 100 emitting light and a second region 200 passing external light therethrough. The first region 100 may include a pixel circuit unit PC including at least one TFT and a light-emitting region PA including an organic light-emitting device (OLED, FIG. 9). The light-emitting region PA may realize white light emission by a first emission unit Pa, a second emission unit Pb, and a third emission unit Pc respectively emitting different colors.

Figure 9:
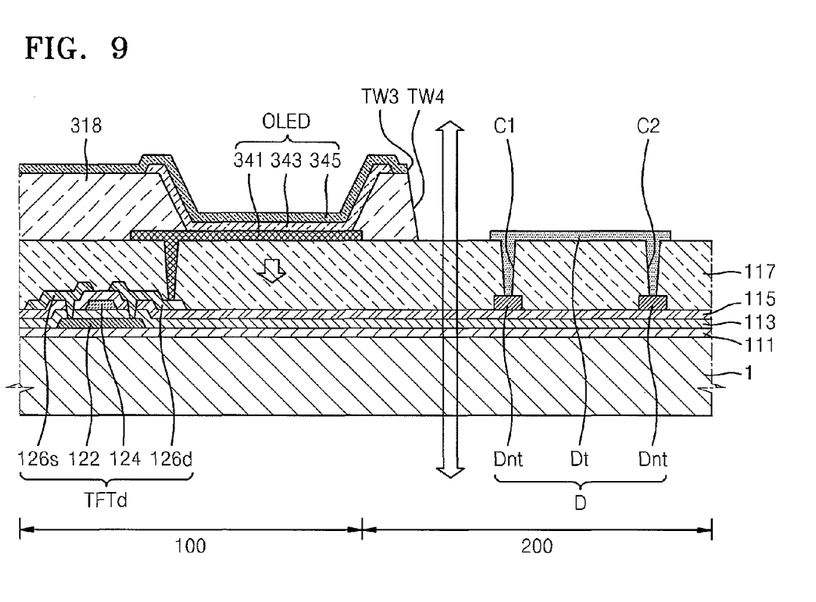
FIG. 9 is a cross-sectional view of an OLED display according to another embodiment.

The pixel circuit unit PC may be placed not to planarly overlap the light-emitting region PA, i.e., a region exposed by a second insulating layer 118 (FIG. 9) of a first electrode 341 (FIG. 9). This structure is suitable for a bottom emission type OLED display in which light is emitted toward the substrate 1 (FIG. 9). Since light is emitted downward from the first electrode 341 (FIG. 9), the pixel circuit unit PC may be placed not to planarly overlap the light-emitting region PA to prevent a path of emitted light from being interfered with by devices included in the pixel circuit unit PC.

The other constituent elements of FIG. 5 are the same as those of FIG. 4, and thus descriptions thereof will not be given herein.

FIG. 6 is a cross-sectional view taken along a line VI-IV' of FIG. 4.

Referring to FIG. 6, the OLED display according to the illustrated embodiment may include a buffer layer 111 formed on a glass or plastic substrate 1.

The buffer layer 111 prevents impurities from penetrating into an active layer 122 and the like from the substrate 1, planarizes the surface of the substrate 1, and may have a single-layered structure or a multi-layered structure formed of an inorganic material such as silicon nitride ($SiN_x$) and/or silicon oxide ($SiO_x$).

A driving TFT TFTd is formed on the buffer layer 111, and the driving TFT TFTd includes the active layer 122, a gate electrode 124 formed to be insulated from the active layer 122, and a source electrode 126a and a drain electrode 126d respectively electrically connected to the active layer 122. A gate insulating layer 113 is formed between the active layer 122 and the gate electrode 124, and an interlayer insulating layer 115 may be formed between the gate electrode 124 and the source and drain electrodes 126s and 126d.

The driving TFT TFTd is a top gate type driving TFT in which the gate electrode 124 is formed on the active layer 122. However, the gate electrode 124 may be formed under the active layer 122.

The active layer 122 may include a variety of materials. For example, the active layer 122 may include inorganic semiconductor materials such as amorphous silicon or crystalline silicon. For example, the active layer 122 may include oxide semiconductor materials or organic semiconductor materials.

The gate electrode 124 may have a single-layered or multi-layered structure including at least one material selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The source electrode 126s and the drain electrode 126d may have a structure with two or more metal layers selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A first insulating layer 117 may be formed on the interlayer insulating layer 115 to cover the source electrode 216s and the drain electrode 216d, and an organic light-emitting device OLED including a first electrode 141 electrically connected to the drain electrode 126d, a second electrode 145 opposite to the first electrode 141, and an organic emission layer 143 interposed between the first electrode 141 and the second electrode 145 and emitting light may be formed on the first insulating layer 117 in the first region 100.

Both edges of the first electrode 141 are covered with the second insulating layer 118, and the second insulating layer 118 may be formed to extend from the first region 100 to the second region 200.

The first electrode 141 may be a reflective electrode and may include a reflection layer including Ag, Mg, Al, Pt, Pd, Au, Ni, Nd, Ir, Cr, and any compound thereof and a transparent or semi-transparent electrode layer formed on the reflection layer. The first electrode 141 may be formed as an independent island form in each sub-pixel.

The second electrode 145 may include a transparent or semi-transparent electrode, may include at least one material selected from the group consisting of Ag, Al, Mg, Li, Ca, Cu, LiF/Ca, LiF/Al, MgAg, and CaAg, and may have a thin film with a thickness of several to several tens nm. The second electrode 145 may be electrically connected to all pixels.

The organic emission layer 143 emitting light may be formed between the first electrode 141 and the second electrode 145, and at least one of a hole injection layer (HIL), a hole transport layer (HTL), an electron transport layer (ETL), and an electron injection layer (EIL) may further be formed therebetween. However, embodiments of the present invention are not limited thereto, and a variety of functional layers may further be formed between the first electrode 141 and the second electrode 145.

The organic emission layer 143 emits light such as red, green, or blue light. The OLED display according to an embodiment may be a top emission type OLED display in which an image is realized in a direction toward the second electrode 145.

Since the image is realized in the direction toward the second electrode 145 in the top emission type OLED display, the pixel circuit unit PC (FIG. 4 including the driving TFT TFTd, and the like, may be formed between the substrate 1 and the first electrode 141, i.e., in a region planarly overlapping the light-emitting region PA (FIG. 4). Thus, the pixel circuit unit PC (FIG. 4) does not occupy separate space, thereby improving an aperture ratio of the OLED display.

Referring to FIGS. 4 and 6, the second wirings D1, D2, and D3 are formed to pass through the first region 100 and the second region 200. At least one D1 of the second wirings D1, D2, and D3 may have a first portion D1*t* formed of a transparent material and a second portion D1*nt* formed of an opaque material and electrically connected to the first portion D1*t*.

The first portion D1t and the second portion D1nt may be formed on different layers. The second portion D1nt of the OLED display may be formed on the same layer and formed of the same material as the source electrode 126s and the drain electrode 126d of the driving TFT TFTd, and the first portion D1t may be formed on the same layer as the first electrode 141 and formed of the same material as a transparent electrode layer included in the first electrode 141. The first portion D1t and the second portion D1nt may be electrically connected to each other via a first contact hole C1 and a second contact hole C2 formed in the first insulating layer 117.

Although not shown herein, to improve transmittance of the second region 200 with respect to external light, the second electrode 145 and the second insulating layer 118 formed in the second region 200 may have openings, and the first portion D1t may also be formed of various materials such as indium tin oxide (ITO), indium zinc oxide (IZO), carbon nanotube, or graphene in addition to the same material as that of the transparent electrode layer included in the first electrode 141.

Figure 7:
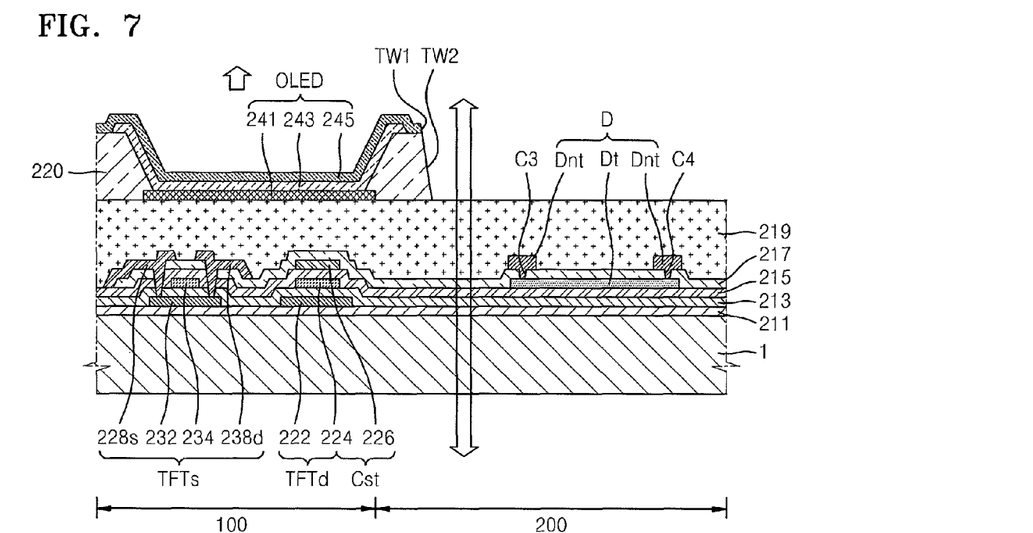
FIG. 7 is a cross-sectional view of an OLED display according to another embodiment.

FIG. 7 is a cross-sectional view of an OLED display according to another embodiment.

Referring to FIG. 7, an OLED display according to the illustrated embodiment may include a buffer layer 111 formed on a glass or plastic substrate 1.

A switching TFT TFTs and a driving TFT TFTd may be formed on the buffer layer 111. The switching TFT TFTs includes an active layer 232, a gate electrode 234 formed to be insulated from the active layer 232, and a source electrode 238s and a drain electrode 238d respectively electrically connected to the active layer 232. A gate insulating layer 213 is formed between the active layer 232 and the gate electrode 234, and a dielectric layer 215 and an interlayer insulating layer 217 may be formed between the gate electrode 234 and the source and drain electrodes 238s and 238d. The driving TFT TFTd includes an active layer 222 and a gate electrode 224 formed to be insulated from the active layer 222. The gate electrode 224 may function as a lower electrode of a capacitor Cst. The dielectric layer 215 is formed on the gate electrode 224, an upper electrode 226 of the capacitor Cst is formed on the dielectric layer 215, and the interlayer insulating layer 217 is formed on the upper electrode 226.

That is, the driving TFT TFTd and the capacitor Cst may be formed to planarly overlap each other.

A first insulating layer 219 may be formed on the interlayer insulating layer 217 to cover the source electrode 238s and the drain electrode 238d, and an organic light-emitting device OLED including a first electrode 241, a second electrode 245 opposite to the first electrode 241, and an organic emission layer 243 interposed between the first electrode 241 and the second electrode 245 and emitting light may be formed on the first insulating layer 219 in the first region 100.

Both edges of the first electrode 241 are covered with a second insulating layer 220, and the second insulating layer 220 may be formed to extend from the first region 100 to the second region 200.

In order to improve transmittance of the second region 200, the second electrode 245 may have a first transmission window TW1 at a position corresponding to the second region 200, and the second insulating layer 220 may include a second transmission window TW2 connected to the first transmission window TW1.

FIG. 7 illustrates that the second electrode 245 and the second insulating layer 220 respectively include the first transmission window TW1 and the second transmission window TW2. However, embodiments of the present invention are not limited thereto, and only one of the second electrode 245 and the second insulating layer 220 may include a transmission window. The first electrode 241 may be a reflective electrode.

The second wiring D formed to pass through the second region 200 may include a first portion Dt formed of a transparent material and a second portion Dnt formed of an opaque material and electrically connected to the first portion Dt.

The first portion Dt and the second portion Dnt may be formed on different layers. The second portion Dnt of the OLED display according to the illustrated embodiment may be formed on the same layer and formed of the same material as the source electrode 238s and the drain electrode 238d of the switching TFT TFTs and the first portion D may be formed on the same layer as the upper electrode 226 of the capacitor Cst.

The first portion Dt may be formed of a transparent material such as indium tin oxide (ITO), indium zinc oxide (IZO), carbon nanotube, and graphene. The first portion Dt and the second portion Dnt may be electrically connected to each other through a third contract hole C3 and a fourth contact hole C4 formed in the interlayer insulating layer 217.

Although the first portion Dt of the second wiring D of the OLED display according to the illustrated embodiment is formed on the same layer as the upper electrode 226 of the capacitor Cst, a first portion of a second wiring of an OLED display according to another embodiment may be formed on the same layer as the gate electrode 234 of the switching TFT TFTs or the gate electrode 224 of the driving TFT TFTd.

Figure 8:
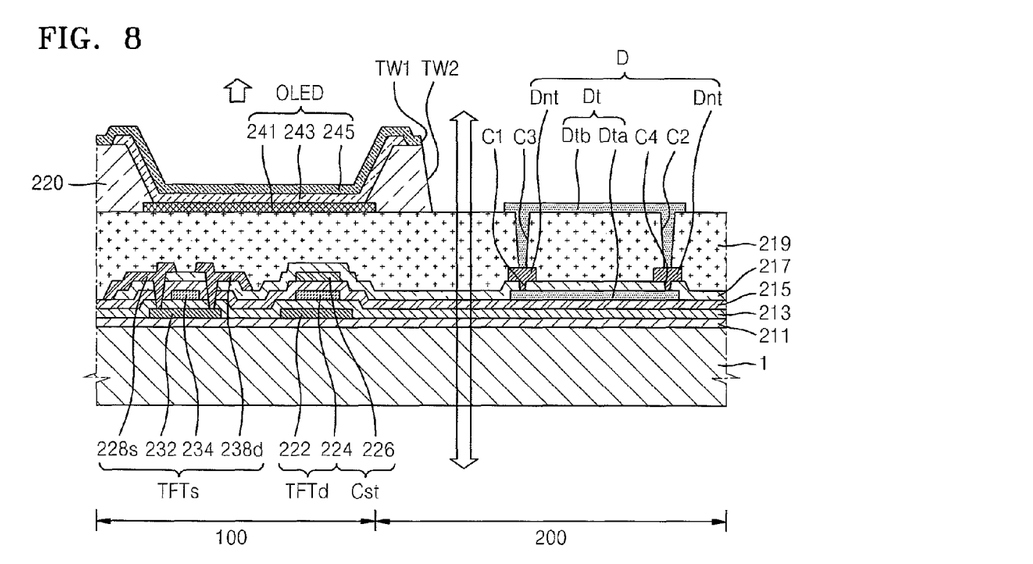
FIG. 8 is a cross-sectional view of an OLED display according to another embodiment.

FIG. 8 is a cross-sectional view of an OLED display according to another embodiment.

Referring to FIG. 8, the second wiring D formed to pass through the second region 200 may include a first portion Dt formed of a transparent material and a second portion Dnt formed of an opaque material and electrically connected to the first portion Dt.

The first portion Dt and the second portion Dnt may be formed on different layers. The second portion Dnt of the OLED display according to the illustrated embodiment is formed on the same layer and formed of the same material as the source electrode 238s and the drain electrode 238d of the switching TFT TFTs, and the first portion Dt may include a first region Dta aimed on the same layer as the upper electrode 226 of the capacitor Cst and a second region Dtb formed on the same layer as the first electrode 241.

The first portion Dt and the second portion Dnt may be electrically connected to each other via a first contact hole C1 and a second contact hole C2 formed in the first insulating layer 219 and via a third contact hole C3 and a fourth contact hole C4 formed in the interlayer insulating layer 217.

According to this configuration, resistance of the second wiring D may be reduced.

The other constituent elements are the same as those of FIG. 7, and thus descriptions thereof will not be given herein.

FIG. 9 is a cross-sectional view of an OLED display according to another embodiment.

Referring to FIG. 9, an OLED display according to the illustrated embodiment may include a buffer layer 111 formed on a glass or plastic substrate 1.

A driving TFT TFTd is formed on the buffer layer 111, and the driving TFT TFTd includes an active layer 122, a gate electrode 124 formed to be insulated from the active layer 122, and a source electrode 126a and a drain electrode 126d respectively electrically connected to the active layer 122. A gate insulating layer 113 is formed between the active layer 122 and the gate electrode 124, and an interlayer insulating layer 115 may be formed between the gate electrode 124 and the source and drain electrodes 126s and 126d.

A first insulating layer 117 may be formed on the interlayer insulating layer 115 to cover the source electrode 216s and the drain electrode 216d, and an organic light-emitting device OLED including a first electrode 341 electrically connected the drain electrode 126d, a second electrode 345 opposite to the first electrode 341, and an organic emission layer 343 interposed between the first electrode 341 and the second electrode 345 and emitting light may be formed on the first insulating layer 115 in the first region 100.

Both edges of the first electrode 341 are covered with the second insulating layer 318, and the second insulating layer 318 may be formed to extend from the first region 100 to the second region 200.

The first electrode 341 may be a transparent or semi-transparent electrode and may include a transparent electrode including at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The first electrode 341 may further include a semi-transmissive layer including at least one selected from the group consisting of Ag, Mg, Al, Pt, Pd, Au, Ni, Nd, Ir, Cr, Li, Ca, and Yb in a thin film form having a thickness of several to several tens of nm.

The second electrode 345 may be a reflective electrode and may include at least one selected from the group consisting of Ag, Al, Mg, Li, Ca, Cu, LiF/Ca, LiF/Al, MgAg, and CaAg.

In order to improve transmittance of the second region 200, the second electrode 345 that is a reflective electrode may have a third transmission window TW3 at a position corresponding to the second region 200, and the second insulating layer 318 may include a fourth transmission window TW4 connected to the third transmission window TW3. The organic emission layer 342, emits light such as red, green, or blue light, and the OLED display according to the illustrated embodiment may be a bottom emission type OLED display in which an image is realized in a direction toward the first electrode 341.

Since the image is realized in the direction toward the first electrode 341 in the bottom emission type OLED display, the pixel circuit unit PC (FIG. 6) including the driving TFT TFTd, and the like cannot be formed between the substrate 1 and the first electrode 141. That is, the pixel circuit unit PC (FIG. 6) may be formed in a region not planarly overlapping the light-emitting region PA (FIG. 6), i.e., the first electrode 341 exposed by the second insulating layer 318.

The second wiring D included in the OLED display according to the illustrated embodiment may include a first portion Dt formed of a transparent material and a second portion Dnt formed of an opaque material and electrically connected to the first portion Dt.

The second portion Dnt is formed on the same layer and formed of the same material as the source electrode 126s and the drain electrode 126d of the driving TFT TFTd, and the first portion Dt is formed on the same layer as the first electrode 341 and formed of the same material as a transparent electrode layer included in the first electrode 341.

The first portion Dt and the second portion Dnt may be electrically connected to each other via a first contact hole C1 and a second contact hole C2 formed in the first insulating layer 117.

At least one of the disclosed embodiments reduces constructive interference of diffracted light by increasing the degree of randomness of the area of the second region 200 included in each of the pixels P1 to P2, thereby improving clearness of the external image According to at least one of the above embodiments, the OLED display has improved clearness with respect to an external image viewed through a transmission region.

It should be understood that the exemplary embodiments described herein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope of the present invention as defined by the following claims.

What is claimed is:

1. An organic light-emitting diode (OLED) display, comprising:
   a substrate; and
   a plurality of pixels formed over the substrate, wherein each of the pixels comprises a first region configured to emit light and a second region configured to pass external light therethrough,
   wherein the second regions of at least three adjacent ones of the pixels have different areas,
   wherein the OLED display further comprises:
   a plurality of first wirings formed in a first direction to pass through the first region; and
   a plurality of second wirings formed in a second direction to pass through the first and second regions, wherein the second wirings are configured to transmit scan or data signals,
   wherein at least one of the second wirings comprises a first portion formed of a transparent material and a second portion formed of an opaque material and electrically connected to the first portion, and wherein the first portion is a scan or data line that has different positions or areas in the three adjacent pixels.

2. The OLED display of claim 1, wherein the second regions of the pixels have randomly defined areas.

3. The OLED display of claim 1, wherein the first region comprises a first emission unit, a second emission unit, and a third emission unit configured to respectively emit different colors, and wherein the second region corresponds to the first emission unit, the second emission unit, and the third emission unit that are adjacent to one another.

4. The OLED display of claim 1,
   wherein the first portion at least partially corresponds to the second region.

5. The OLED display of claim 4, wherein the first portion of the second wiring comprises at least one material selected from the group consisting of indium tin oxide (ITO), indium zinc oxide (IZO), carbon nanotube, and graphene.

6. The OLED display of claim 4, further comprising:
   a plurality of pixel circuit units respectively placed in the first regions of each pixel, wherein each of the pixel circuit units comprises at least one thin film transistor (TFT) and a capacitor;

a first insulating layer covering the pixel circuit units;
a plurality of first electrodes formed over the first insulating layer, independently formed in the first region of each of the pixels, and electrically connected to each of the pixel circuit units;
a second insulating layer covering at least one portion of the first electrode;
a second electrode opposite to the first electrode, electrically connected to each of the pixels, and formed at least in the first region in each of the pixels; and
an organic emission layer interposed between the first and second electrodes and configured to emit light.

7. The OLED display of claim 6, wherein the first and second portions of the at least one second wiring are formed on different layers.

8. The OLED display of claim 7, wherein the TFT comprises:
an active layer formed over the substrate;
a gate electrode formed at a position corresponding to the active layer to be insulated from the active layer;
an interlayer insulating layer formed over the gate electrode; and
a source electrode and a drain electrode formed over the interlayer insulating layer, wherein each of the source and drain electrodes is electrically connected to the active layer, and
wherein the capacitor comprises:
a lower electrode formed on the same layer as the gate electrode; and
an upper electrode insulated from the lower electrode.

9. The OLED display of claim 8, wherein the first portion of the at least one second wiring is formed on the same layer as the first electrode, the gate electrode, and/or the upper electrode, wherein the second portion of the at least one second wiring is formed on the same layer as the source electrode and the drain electrode, and wherein the first insulating layer and/or the interlayer insulating layer have a contact hole electrically connecting the first portion with the second portion.

10. The OLED display of claim 6, wherein the first electrode is a reflective electrode, wherein the second electrode is a transparent or semi-transparent electrode, and wherein the pixel circuit unit is placed at a region at least partially overlapping the first region in a plan view.

11. The OLED display of claim 6, wherein the first electrode is a transparent or semi-transparent electrode, wherein the second electrode is a reflective electrode, and wherein the pixel circuit unit is placed at a region not overlapping a region exposed by the second insulating layer of the first electrode in a plan view.

12. The OLED display of claim 6, wherein the second electrode comprises a first transmission window at a position corresponding to the second region.

13. The OLED display of claim 12, wherein the second insulating layer comprises a second transmission window connected to the first transmission window.

14. The OLED display of claim 1, wherein the first portion of the at least one second wiring is formed on the same layer as a gate electrode and/or an upper capacitor electrode, and wherein the second portion of the at least one second wiring is formed on the same layer as a source electrode and a drain electrode.

15. An organic light-emitting diode (OLED) display, comprising:
a substrate;
a plurality of pixels formed over the substrate, wherein each of the pixels comprises a first region configured to emit light and a second region configured to substantially transmit external light; and
a plurality of wirings crossing the first and second regions, wherein at least one of the wirings comprises a first portion formed of a transparent material,
wherein the wirings are configured to transmit scan or data signals, wherein the first portion is a scan or data line that has different positions or areas in at least three adjacent ones of the pixels, and
wherein the at least one wiring comprises a second portion formed of an opaque material and electrically connected to the first portion.

16. The OLED display of claim 15, wherein the first portion of the at least one wiring is formed of one or more of: indium tin oxide (ITO), indium zinc oxide (IZO), carbon nanotube, and graphene.

17. The OLED display of claim 15, wherein the first and second portions of the at least one wiring are formed on different layers.

18. The OLED display of claim 15, wherein the second regions of the at least three adjacent pixels have different areas.

19. The OLED display of claim 15, wherein the second regions of the pixels have different areas.

20. The OLED display of claim 15, wherein the area of the second region in a selected pixel is greater than that of the first region in the selected pixel.

* * * * *